US009718669B2

(12) United States Patent
Chen et al.

(10) Patent No.: US 9,718,669 B2
(45) Date of Patent: Aug. 1, 2017

(54) MEMS PRESSURE SENSOR AND METHOD OF MANUFACTURING THE SAME

(71) Applicant: TAIWAN SEMICODUCTOR MANUFACTURING CO., LTD., Hsinchu (TW)

(72) Inventors: Tung-Tsun Chen, Hsinchu (TW); Chia-Hua Chu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/984,469

(22) Filed: Dec. 30, 2015

(65) Prior Publication Data

US 2017/0190567 A1 Jul. 6, 2017

(51) Int. Cl.
H01L 29/84 (2006.01)
B81B 1/00 (2006.01)
B81C 1/00 (2006.01)

(52) U.S. Cl.
CPC .......... *B81B 1/004* (2013.01); *B81C 1/00087* (2013.01); *B81B 2201/0264* (2013.01); *B81C 2201/019* (2013.01)

(58) Field of Classification Search
CPC ............ B81C 1/00238; B81C 1/00793; B81B 7/0061
USPC .......................................................... 257/416
See application file for complete search history.

(56) References Cited

U.S. PATENT DOCUMENTS

| 2010/0052082 A1* | 3/2010 | Lee ........................ B81B 7/0061 |
| | | 257/416 |
| 2012/0043627 A1* | 2/2012 | Lin .......................... B81B 7/02 |
| | | 257/415 |
| 2014/0001584 A1 | 1/2014 | Liu |
| 2015/0158722 A1* | 6/2015 | Lim ........................ B81B 7/02 |
| | | 257/416 |
| 2015/0266723 A1* | 9/2015 | Chan ....................... H04R 1/08 |
| | | 381/173 |
| 2015/0298965 A1* | 10/2015 | Tsai ..................... B81C 1/00182 |
| | | 257/415 |

FOREIGN PATENT DOCUMENTS

EP   2 871 456 A1   5/2015

OTHER PUBLICATIONS

Hein. S, etc., "Capacitive differential pressure sensor with high overload capability using silicon/glass technology," Solid State Sensors and Actuators, 1997.
European Editors, "Keeping Track of Industrial Processes with Sensors", Contributed by Publitek Marketing Communications, Jun. 7, 2012.

* cited by examiner

*Primary Examiner* — Trung Q Dang
(74) *Attorney, Agent, or Firm* — Maschoff Brennan

(57) ABSTRACT

A micro-electro mechanical system (MEMS) pressure sensor includes a first substrate, a second substrate and a sensing structure. The second substrate is substantially parallel to the first substrate. The sensing structure is between the first substrate and the second substrate, and bonded to a portion of the first substrate and a portion of the second substrate, in which a first space between the first substrate and the sensing structure is communicated with outside, and a second space between the second substrate and the sensing structure is communicated with or isolated from the outside.

20 Claims, 3 Drawing Sheets

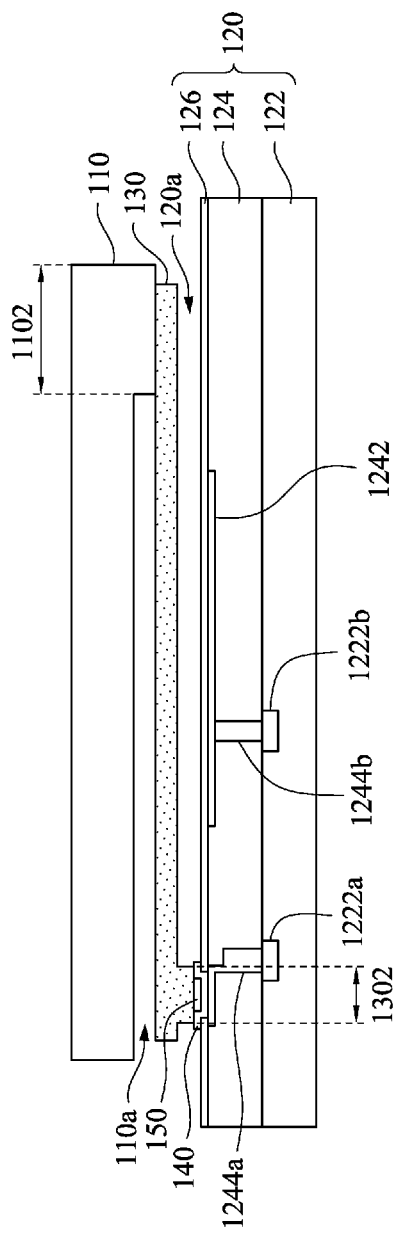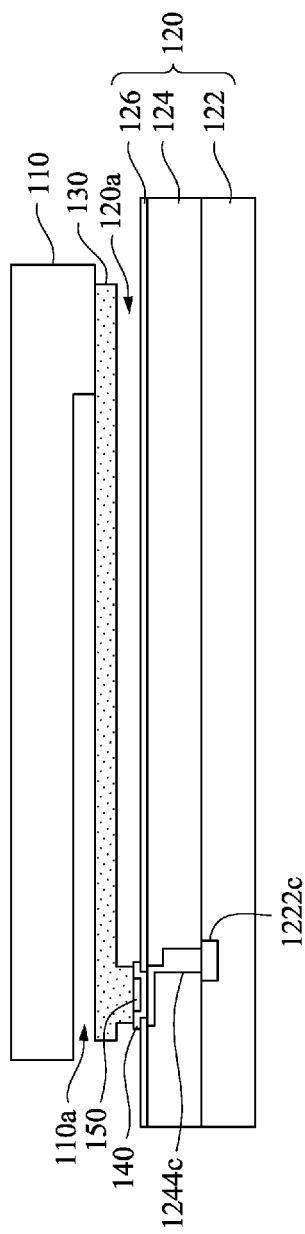

MEMS PRESSURE SENSOR AND METHOD OF MANUFACTURING THE SAME

BACKGROUND

Generally, a pressure sensor chip and a sensing circuit chip are formed and then packaged together. However, etching processes for forming deep through holes at chip level and at package level are difficult and costly. Alignment of the deep through holes is also difficult and costly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a cross-sectional view of a MEMS pressure sensor in accordance with some embodiments of the present disclosure.

FIG. 4 is a cross-sectional view of a MEMS pressure sensor in accordance with some embodiments of the present disclosure.

DETAILED DESCRIPTION

Figure 1:
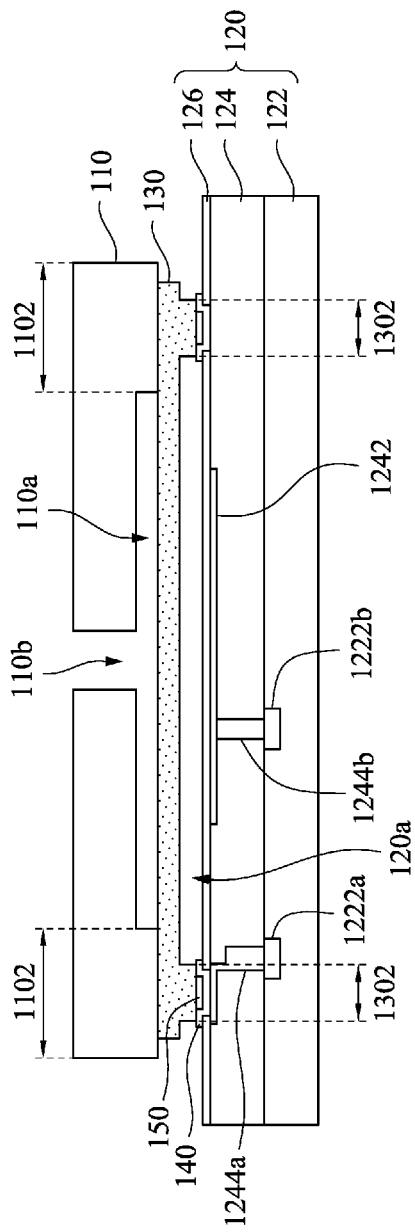
FIG. 1 is a cross-sectional view of a micro-electro mechanical system (MEMS) pressure sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, previous methods of forming a pressure sensor chip and its package are difficult and costly. Accordingly, the present disclosure provides a monolithic micro-electro mechanical system (MEMS) pressure sensor and a method of manufacturing the same with low manufacturing cost. The MEMS pressure sensor is also compatible to an inertial sensor. Embodiments of the MEMS pressure sensor and the method of manufacturing the same will be described in detail below.

FIG. 1 is a cross-sectional view of a MEMS pressure sensor in accordance with some embodiments of the present disclosure. The MEMS pressure sensor includes a first substrate 110, a second substrate 120 and a sensing structure 130.

The second substrate 120 is substantially parallel to the first substrate 110. The term "substantially parallel" refers to the two elongated members being parallel or almost parallel. In some embodiments, each of the first substrate 110 and the second substrate 120 includes a bulk substrate, such as silicon substrate or a non-silicon substrate. In some embodiments, the first substrate 110 or the second substrate 120 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, the first substrate 110 has a planar dimension (in top view) smaller than a planar dimension (in top view) of the second substrate 120.

In some embodiments, the first substrate 110 is a MEMS substrate. In some embodiments, the MEMS substrate includes a bulk substrate (e.g., silicon substrate) and an epitaxial layer thereover. In some embodiments, the MEMS substrate includes a buried oxide (BOX) layer. In some embodiments, the MEMS substrate includes metal, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, any other suitable material or a combination thereof. Exemplary metal structures within the MEMS substrate include metal traces, metal contacts and metal layers. In some embodiments, the first substrate 110 includes a first protruding peripheral portion 1102. In some embodiments, the first protruding peripheral portion 1102 is open shaped (e.g., U shaped) or enclosed shaped (e.g., rectangular or circular shaped) in top view.

In some embodiments, the second substrate 120 includes a bulk substrate 122 (e.g., silicon substrate). In some embodiments, the second substrate 120 includes passive components such as resistors, capacitors, inductors, and/or fuses; active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. In some embodiments, the second substrate 120 includes a first transistor 1222a and a second transistor 1222b at top of the bulk substrate 122. In some embodiments, the first transistor 1222a and the second transistor 1222b are CMOS transistors, such as PMOS transistors and/or NMOS transistors.

In some embodiments, the second substrate 120 includes integrated circuits, such as memory cells, analog circuits, logic circuits and/or mixed-signal circuits. In some embodiments, the second substrate 120 includes an interconnect and interlayer dielectric (ILD) layer 124. In some embodiments, the interconnect and ILD layer 124 includes interconnect (e.g., metal lines and vias) associated with passive components, active components or a combination thereof. In some embodiments, the interconnect and ILD layer 124 includes ILD, which is made of silicon oxide, silicon nitride, silicon oxynitride, any other suitable material or a combination thereof.

In some embodiments, the second substrate 120 includes a conductive layer 1242 at top of the interconnect and ILD layer 124 and facing the sensing structure 130. In some embodiments, the conductive layer 1242 is substantially parallel to the sensing structure 130. In some embodiments, the conductive layer 1242 is made of metal or a metal compound, such as Mo, Cr, Al, Nd, Ti, Cu, Ag, Au, Zn, In, Ga, any other suitable material or a combination thereof.

In some embodiments, the second substrate 120 further includes an insulating layer 126 over the conductive layer 1242. In some embodiments, the insulating layer 126 is made of silicon oxide, silicon nitride, silicon oxynitride, any other suitable material or a combination thereof. In some embodiments, the insulating layer 126 is configured to prevent the conductive layer 1242 from corrosion.

In some embodiments, the second substrate 120 includes a first sensing circuit 1244a and a second sensing circuit 1244b in the interconnect and ILD layer 124. In some embodiments, the first sensing circuit 1244a and the second sensing circuit 1244b are respectively coupled to the sensing structure 130 and the conductive layer 1242. In some embodiments, the first sensing circuit 1244a and the second sensing circuit 1244b are respectively coupled to the first transistor 1222a and the second transistor 1222b. Therefore, potential of the sensing structure 130 can be measured through the first sensing circuit 1244a and the first transistor 1222a, and potential of the conductive layer 1242 can be measured through the second sensing circuit 1244b and the second transistor 1222b.

The sensing structure 130 is between the first substrate 110 and the second substrate 120, and bonded to a portion of the first substrate 110 and a portion of the second substrate 120. In some embodiments, the sensing structure 130 is made of a conductive material, such as silicon. In some embodiments, the sensing structure 130 is made of hard conductive material. In some embodiments, the sensing structure 130 includes a second protruding peripheral portion 1302 bonding to the second substrate 120. In some embodiments, the second protruding peripheral portion 1302 is open shaped (e.g., U shaped) or enclosed shaped (e.g., rectangular or circular shaped) in top view. In some embodiments, the first protruding peripheral portion 1102 of the first substrate 110 is substantially aligned with the second protruding peripheral portion 1302 of the sensing structure 130. In some embodiments, the first protruding peripheral portion 1102 has an upper surface (not marked) greater than or equal to an upper surface (not marked) of the second protruding peripheral portion 1302.

In some embodiments, the MEMS pressure sensor includes a first bonding pad 140 and a second bonding pad 150. In some embodiments, the first bonding pad 140 and the second bonding pad 150 are made of metal, alloy, semiconductor material or a combination thereof. In some embodiments, the first bonding pad 140 is over the bonded portion of the second substrate 120. In some embodiments, the first bonding pad 140 is coupled or directly connected to the first sensing circuit 1244a. In some embodiments, the second bonding pad 150 is between the sensing structure 130 and the first bonding pad 140. In some embodiments, the second bonding pad 150 is coupled or directly connected to the sensing structure 130. In some embodiments, the first sensing circuit 1244a is coupled to the sensing structure 130 through the first bonding pad 140 and the second bonding pad 150. In some embodiments, the second bonding pad 150 is over the second protruding peripheral portion 1302. In some embodiments, the first bonding pad 140 has a concave portion (not marked) substantially aligned with a convex portion (not marked) of the second bonding pad 150. In some embodiments, the first bonding pad 140 is bonded to the second bonding pad 150 by eutectic bonding, diffusion bonding or any other suitable bonding type. In some embodiments, the eutectic bonding is Ge/Al, Ge/Au or Si/Au. In some embodiments, the diffusion bonding is Si/Al or Si/Ti.

In some embodiments, a first space 110a between the first substrate 110 and the sensing structure 130 is communicated with outside; that is, the first space 110a is an open space. In some embodiments, the first substrate 110 includes a through hole 110b through the first substrate 110, and the first space 110a is communicated with the outside through the through hole 110b. In some embodiments, the through hole 110b faces the sensing structure 130. In some embodiments, the first space 110a is configured to accommodate test atmosphere with unknown pressure.

In some embodiments, a second space 120a between the second substrate 120 and the sensing structure 130 is communicated with or isolated from the outside; that is, the second space 120a is an open space or enclosed space. In some embodiments, as shown in FIG. 1, the second space 120a is isolated from the outside. In some embodiments, the second space 120a is vacuum or accommodates atmosphere with known pressure. Pressure difference between the first space 110a and the second space 120a will result in deformation of the sensing structure 130. The unknown pressure of the test atmosphere of the first space 110a can be derived from characteristic parameters (e.g., capacitance or resistance) related to the deformation of the sensing structure 130.

In some embodiments, the sensing structure 130, the conductive layer 1242 and the second space 120a therebetween constitute a capacitor. In some embodiments, the MEMS pressure sensor of FIG. 1 is a capacitive type MEMS absolute pressure sensor. In some embodiments, the unknown pressure of the test atmosphere of the first space 110a is obtained through capacitance change of the capacitor. In some embodiments, the first sensing circuit 1244a and the second sensing circuit 1244b are configured to measure the capacitance of the capacitor.

Specifically, for example, each of the first space 110a and the second space 120a has known pressure, and the sensing structure 130 has initial deformation with an initial gap $d_0$, which can be called as a correction gap. Subsequently, the first space 110a is communicated with the test atmosphere having the unknown pressure, and the second space 120a still has the same known pressure, and the sensing structure 130 has deformation with a gap d'. Capacitance change= (dielectric constant of the second space 120a)×(planar area of the sensing structure 130)×($1/d'-1/d_0$). The unknown pressure of the test atmosphere of the first space 110a can be calculated through the capacitance change, F=P/A and Hooke's Law.

Figure 2:
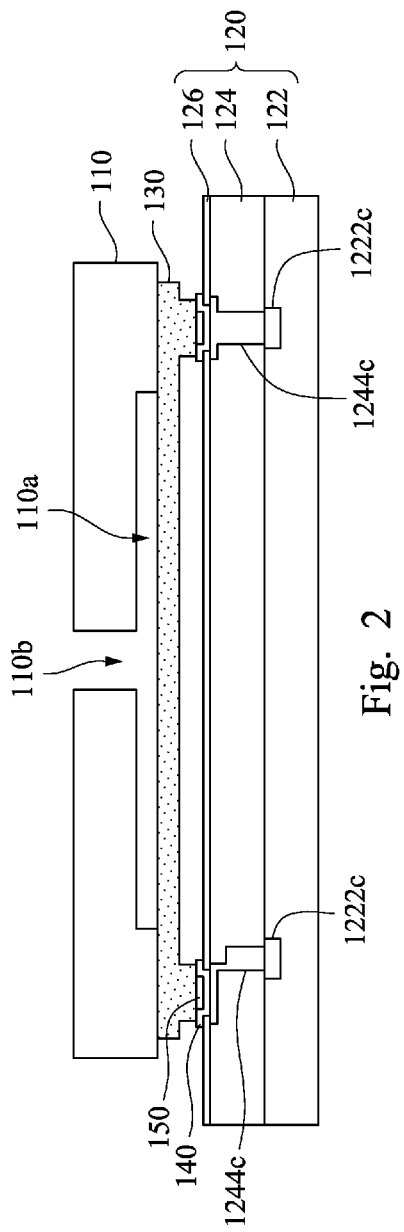
FIG. 2 is a cross-sectional view of a MEMS pressure sensor in accordance with some embodiments of the present disclosure.

FIG. 2 is a cross-sectional view of a MEMS pressure sensor in accordance with some embodiments of the present disclosure. The difference between FIGS. 2 and 1 is that in FIG. 2, a second substrate 120 includes a third sensing circuit 1244c coupled to a sensing structure 130 and configured to measure resistance of the sensing structure 130. In some embodiments, the third sensing circuit 1244c has two terminals (not marked) coupled to the sensing structure 130 and separated from each other. In some embodiments, a first bonding pad 140 is coupled or directly connected to the third sensing circuit 1244c. In some embodiments, the third sensing circuit 1244c is coupled to the sensing structure 130 through the first bonding pad 140 and a second bonding pad 150. In some embodiments, the second substrate 120 includes a third transistor 1222c at top of a bulk substrate 122 and coupled to the third sensing circuit 1244c.

In some embodiments, the MEMS pressure sensor of FIG. 2 is a piezo-resistive type MEMS absolute pressure sensor. In some embodiments, unknown pressure of test atmosphere of the first space 110a is obtained by resistance change of the sensing structure 130.

Specifically, for example, each of the first space 110a and the second space 120a has known pressure, and the sensing structure 130 has initial resistance $R_0$. Subsequently, the first space 110a is communicated with the test atmosphere having the unknown pressure, and the second space 120a still has the same known pressure, and the sensing structure 130 has resistance R'. Resistance change=$R'-R_0$. The unknown pressure of the test atmosphere of the first space 110a can be calculated through the resistance change, F=P/A and Hooke's Law.

FIG. 3 is a cross-sectional view of a MEMS pressure sensor in accordance with some embodiments of the present disclosure. The difference between FIG. 3 and FIG. 1 is that a second space 120a of FIG. 3 is communicated with outside; that is, the second space 120a is an open space. In some embodiments, the second space 120a is communicated with atmosphere having known pressure. In some embodiments, a first protruding portion 1102 of a first substrate 110 has an opening in top view (e.g., left side of a first space 110a of FIG. 3); a second protruding portion 1302 of a sensing structure 130 has an opening in top view (e.g., right side of the second space 120a of FIG. 3). In some embodiments, the opening of the second protruding portion 1302 and the opening of the first protruding portion 1102 are disposed at different sides in top view. In some embodiments, the opening of the second protruding portion 1302 and the opening of the first protruding portion 1102 are disposed at opposite sides in top view.

In some embodiments, the sensing structure 130, the conductive layer 1242 and the second space 120a therebetween constitute a capacitor. In some embodiments, the MEMS pressure sensor of FIG. 3 is a capacitive type MEMS differential pressure sensor. Similar to the capacitive type MEMS absolute pressure sensor of FIG. 1, the unknown pressure of test atmosphere of the first space 110a is obtained through capacitance change of the capacitor.

Specifically, for example, each of the first space 110a and the second space 120a has known pressure, and the sensing structure 130 has initial deformation with an initial gap $d_0$, which can be called as a correction gap. Subsequently, the first space 110a is communicated with the test atmosphere having the unknown pressure, and the second space 120a still has the same known pressure, and the sensing structure 130 has deformation with a gap d'. Capacitance change= (dielectric constant of the second space 120a)×(planar area of the sensing structure 130)×($1/d'-1/d_0$). The unknown pressure of the test atmosphere of the first space 110a can be calculated through the capacitance change, F=P/A and Hooke's Law.

FIG. 4 is a cross-sectional view of a MEMS pressure sensor in accordance with some embodiments of the present disclosure. The difference between FIGS. 4 and 3 is that in FIG. 4, a second substrate 120 includes a third sensing circuit 1244c coupled to a sensing structure 130 and configured to measure resistance of the sensing structure 130. In some embodiments, the third sensing circuit 1244c has two terminals (one is shown, and another one is not shown) coupled to the sensing structure 130 and separated from each other. In some embodiments, a first bonding pad 140 is coupled or directly connected to the third sensing circuit 1244c. In some embodiments, the third sensing circuit 1244c is coupled to the sensing structure 130 through the first bonding pad 140 and a second bonding pad 150. In some embodiments, the second substrate 120 includes a third transistor 1222c at top of a bulk substrate 122 and coupled to the third sensing circuit 1244c.

In some embodiments, the MEMS pressure sensor of FIG. 4 is a piezo-resistive type MEMS differential pressure sensor. Similar to the piezo-resistive type MEMS absolute pressure sensor of FIG. 2, unknown pressure of test atmosphere of a first space 110a is obtained by resistance change of the sensing structure 130.

Specifically, for example, each of the first space 110a and the second space 120a has known pressure, and the sensing structure 130 has initial resistance $R_0$. Subsequently, the first space 110a is communicated with the test atmosphere having the unknown pressure, and the second space 120a still has the same known pressure, and the sensing structure 130 has resistance R'. Resistance change=$R'-R_0$. The unknown pressure of the test atmosphere of the first space 110a can be calculated through the resistance change, F=P/A and Hooke's Law.

Figures 5A, 5B, 5C:
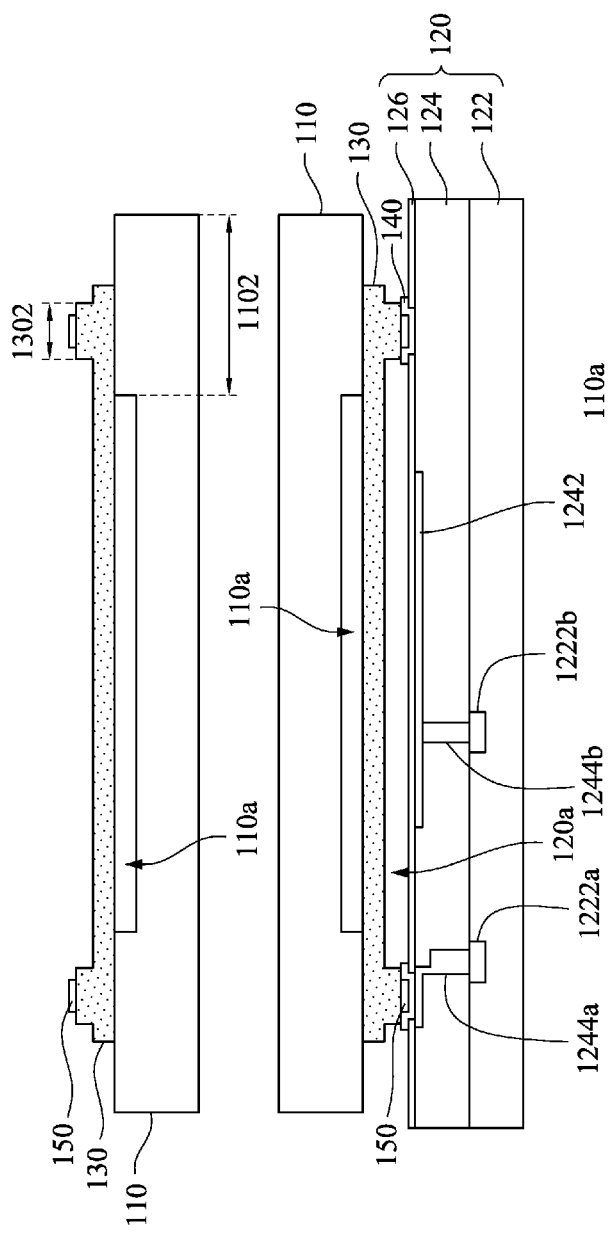
FIGS. 5A to 5C are cross-sectional views at various stages of forming a MEMS pressure sensor of FIG. 1 in accordance with some embodiments of the present disclosure.

FIGS. 5A to 5C are cross-sectional views at various stages of forming a MEMS pressure sensor of FIG. 1 in accordance with some embodiments of the present disclosure. It is noted that operations of the method described below may be altered or substituted to manufacture other type MEMS pressure sensors, such as the MEMS pressure sensor of FIG. 2, 3 or 4.

In some embodiments, as shown in FIG. 5A, a first substrate 110 is received or provided. In some embodiments, the first substrate 110 includes a first protruding peripheral portion 1102. In some embodiments, the first protruding peripheral portion 1102 is formed using any patterning processes, such as photolithographic and etching processes, laser drill process or any other suitable processes. In some embodiments, the first protruding peripheral portion 1102 is open shaped (e.g., U shaped) or enclosed shaped (e.g., rectangular or circular shaped) in top view.

In some embodiments, as shown in FIG. 5A, a sensing structure 130 is received or provided. In some embodiments, the sensing structure 130 includes a second protruding peripheral portion 1302. In some embodiments, the second protruding peripheral portion 1302 is formed using any patterning processes, such as photolithographic and etching processes, laser drill process or any other suitable processes. In some embodiments, the second protruding peripheral portion 1302 is open shaped (e.g., U shaped) or enclosed shaped (e.g., rectangular or circular shaped) in top view. In some embodiments, a second bonding pad 150 is formed over the sensing structure 130. In some embodiments, the second bonding pad 150 is made of metal, alloy or semiconductor materials.

As shown in FIG. 5A, a portion on a side of the sensing structure 130 is bonded to a portion of the first substrate 110 (e.g., the first protruding peripheral portion 1102) to form a first space 110a between the first substrate 110 and the sensing structure 130. In some embodiments, the portion on the side of the sensing structure 130 is bonded to the portion of the first substrate 110 by a thermal process. In some embodiments, there is silicon bonding between the sensing structure 130 and the portion of the first substrate 110. In some embodiments, the first space 110a is communicated with or isolated from outside.

In some embodiments, as shown in FIG. 5B, a second substrate 120 is received. In some embodiments, the second substrate 120 includes a bulk substrate 122. In some embodiments, the second substrate 120 includes transistors in the bulk substrate 120, such as a first transistor 1222a and a second transistor 1222b. In some embodiments, the second substrate 120 includes an interconnect and ILD layer 124. In some embodiments, the second substrate 120 includes sensing circuit(s) in the interconnect and ILD layer 124, such as a first sensing circuit 1244a and a second sensing circuit 1244b. In some embodiments, the sensing circuit(s) is configured to measure capacitance, resistance or any other suitable characteristic parameter. In some embodiments, a first bonding pad 140 is formed over the second substrate 120.

In some embodiments, as shown in FIGS. 5A and 5B, the first substrate 110 and the sensing structure 130 are reversed, and a portion on an opposite side of the sensing structure 130 (e.g., the second protruding peripheral portion 1302) is bonded to a portion of the second substrate 120 to form a second space 120a between the second substrate 120 and the sensing structure 130. In some embodiments, the portion on the opposite side of the sensing structure 130 is bonded to the portion of the second substrate 120 by a thermal process. In some embodiments, the second bonding pad 150 is bonded to the first bonding pad 140 by a thermal process. In some embodiments, there is eutectic bonding, such as Ge/Al, Ge/Au or Si/Au, or diffusion bonding, such as Si/Al or Si/Ti, between the second bonding pad 150 and the first bonding pad 140. In some embodiments, the second space 120a is communicated with or isolated from the outside.

In some embodiments, as shown in FIGS. 5B and 5C, another portion of the first substrate 110 is removed. The other portion of the first substrate 110 is not overlapped with the sensing structure 130. Accordingly, the first substrate 110 has a planar dimension (in top view) smaller than a planar dimension (in top view) of the second substrate 120. In some embodiments, the other portion of the first substrate 110 is removed by etching or dicing. In some embodiments, the first substrate 110 has a groove (not shown) for etching or dicing. In some embodiments, the other portion of the first substrate 110 is removed after the portion on the opposite side of the sensing structure 130 is bonded to the portion of the second substrate 120.

In some embodiments, as shown in FIGS. 5C and 1, a through hole 110b is formed through the first substrate 110. In some embodiments, the through hole 110b is formed by performing an etching process, laser drill process or any other suitable removal process. In some embodiments, the through hole 110b is formed after the portion on the opposite side of the sensing structure 130 is bonded to a portion of the second substrate 120 or before the portion on the side of the sensing structure 130 is bonded to the portion of the first substrate 110.

According to some embodiments, a MEMS pressure sensor includes a first substrate, a second substrate and a sensing structure. The second substrate is substantially parallel to the first substrate. The sensing structure is between the first substrate and the second substrate, and bonded to a portion of the first substrate and a portion of the second substrate, in which a first space between the first substrate and the sensing structure is communicated with outside, and a second space between the second substrate and the sensing structure is communicated with or isolated from the outside.

According to some embodiments, a MEMS pressure sensor includes a first substrate, a second substrate and a sensing structure. The first substrate includes a first protruding peripheral portion. The second substrate is substantially parallel to the first substrate. The sensing structure is between the first substrate and the second substrate, and bonded to the first protruding peripheral portion of the first substrate, and includes a second protruding peripheral portion bonding to the second substrate.

According to some embodiments, a method of manufacturing a MEMS pressure sensor includes: bonding a portion on a side of a sensing structure to a portion of a first substrate to form a first space between the first substrate and the sensing structure; and bonding a portion on an opposite side of the sensing structure to a portion of a second substrate to form a second space between the second substrate and the sensing structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electro mechanical system (MEMS) pressure sensor, comprising:
    a first substrate;
    a second substrate substantially parallel to the first substrate; and
    a sensing structure between the first substrate and the second substrate, and bonded to a portion of the first substrate and a portion of the second substrate, wherein a first space between the first substrate and the sensing structure is communicated with outside, and a second space between the second substrate and the sensing structure is communicated with or isolated from the outside,
    wherein the second substrate comprises:
        a first sensing circuit coupled to the sensing structure and configured to measure potential or resistance of the sensing structure.

2. The MEMS pressure sensor of claim 1, wherein the first substrate comprises a through hole through the first substrate and facing the sensing structure.

3. The MEMS pressure sensor of claim 1, wherein the second substrate further comprises a conductive layer facing the sensing structure.

4. The MEMS pressure sensor of claim 3, wherein the second substrate further comprises an insulating layer over the conductive layer.

5. The MEMS pressure sensor of claim 3, wherein the second substrate further comprises a second sensing circuit coupled to the conductive layer.

6. The MEMS pressure sensor of claim 1, further comprising:

a first bonding pad over the portion of the second substrate; and a second bonding pad between the sensing structure and the first bonding pad.

7. A MEMS pressure sensor, comprising:

a first substrate comprising a first protruding peripheral portion;

a second substrate substantially parallel to the first substrate; and a sensing structure between the first substrate and the second substrate, and bonded to the first protruding peripheral portion of the first substrate, and comprising a second protruding peripheral portion bonding to the second substrate, wherein the second substrate comprises:

a first sensing circuit coupled to the sensing structure and configured to measure potential or resistance of the sensing structure.

8. The MEMS pressure sensor of claim 7, wherein the first protruding peripheral portion of the first substrate is substantially aligned with the second protruding peripheral portion of the sensing structure.

9. The MEMS pressure sensor of claim 7, wherein the first protruding peripheral portion has an upper surface greater than or equal to an upper surface of the second protruding peripheral portion.

10. The MEMS pressure sensor of claim 7, further comprising:

a first bonding pad over the second substrate; and a second bonding pad over the second protruding peripheral portion and in contact with the first bonding pad.

11. The MEMS pressure sensor of claim 7, wherein the first substrate comprises a through hole through the first substrate and facing the sensing structure.

12. The MEMS pressure sensor of claim 7, wherein the second substrate further comprises a conductive layer facing the sensing structure.

13. The MEMS pressure sensor of claim 12, wherein the second substrate further comprises an insulating layer over the conductive layer.

14. The MEMS pressure sensor of claim 12, wherein the second substrate further comprises a second sensing circuit coupled to the conductive layer.

15. The MEMS pressure sensor of claim 7, wherein the first substrate has a planar dimension smaller than a planar dimension of the second substrate.

16. A method of manufacturing a MEMS pressure sensor, comprising:

bonding a portion on a side of a sensing structure to a portion of a first substrate to form a first space between the first substrate and the sensing structure; and bonding a portion on an opposite side of the sensing structure to a portion of a second substrate to form a second space between the second substrate and the sensing structure, wherein the second substrate comprises a first sensing circuit coupled to the sensing structure through the portion of the second substrate, and the first sensing circuit is configured to measure potential or resistance of the sensing structure.

17. The method of claim 16, further comprising forming a through hole through the first substrate.

18. The method of claim 16, further comprising removing another portion of the first substrate, which is not overlapped with the sensing structure.

19. The MEMS pressure sensor of claim 1, wherein the first space is configured to accommodate test atmosphere.

20. The MEMS pressure sensor of claim 1, wherein the second space is vacuum or accommodates atmosphere with known pressure.

* * * * *